United States Patent
Kamins et al.

(10) Patent No.: US 8,198,706 B2
(45) Date of Patent: Jun. 12, 2012

(54) MULTI-LEVEL NANOWIRE STRUCTURE AND METHOD OF MAKING THE SAME

(75) Inventors: Theodore I. Kamins, Palo Alto, CA (US); Nathaniel Quitoriano, Pacifica, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 822 days.

(21) Appl. No.: 12/243,853

(22) Filed: Oct. 1, 2008

(65) Prior Publication Data

US 2010/0019355 A1 Jan. 28, 2010

Related U.S. Application Data

(60) Provisional application No. 61/083,822, filed on Jul. 25, 2008.

(51) Int. Cl.
*H01L 29/04* (2006.01)
*H01L 21/20* (2006.01)
(52) U.S. Cl. ........ 257/627; 438/478; 977/813; 977/778; 977/762
(58) Field of Classification Search .................. None
See application file for complete search history.

(56) References Cited

U.S. PATENT DOCUMENTS

| | | | |
|---|---|---|---|
| 2005/0224888 A1* | 10/2005 | Graham et al. | 257/368 |
| 2006/0273328 A1* | 12/2006 | Niu et al. | 257/79 |
| 2007/0114657 A1* | 5/2007 | Dangelo et al. | 257/720 |
| 2007/0272914 A1* | 11/2007 | Lai et al. | 257/9 |
| 2008/0149944 A1* | 6/2008 | Samuelson et al. | 257/88 |

FOREIGN PATENT DOCUMENTS

| | | | |
|---|---|---|---|
| JP | 2008 108757 | * | 5/2008 |
| JP | 2008108757 | * | 5/2008 |

OTHER PUBLICATIONS

Mohan et al, "Controlled growth of highly uniform axial/radial direction-defined, individually addressable InP nano wire arrays", Nanotechnology, 16 (2005) 2903-2907 (Mohan).*
Lee et al, Solid State Communications 129 (2004), 583-587.*
Mohan et al, "Controlled growth of highly uniform axial/radial direction-defined, individually addressable InP nano wire arrays", Nanotechnology, 16 (2005) 2903-2907.*

* cited by examiner

*Primary Examiner* — Melvin Hayes
*Assistant Examiner* — Bijay Saha (57) ABSTRACT

A method for making a multi-level nanowire structure includes establishing a first plurality of nanowires on a substrate surface, wherein at least some of the nanowires are i) aligned at a predetermined crystallographically defined angle with respect to the substrate surface, ii) aligned substantially perpendicular with respect to the substrate surface, or iii) combinations of i and ii. An insulating layer is established between the nanowires of the first plurality such that one of two opposed ends of at least some of the nanowires positioned i) at the predetermined crystallographically defined angle, ii) substantially perpendicular with respect to the substrate surface, or iii) combinations of i and ii is exposed. Regions are grown from each of the exposed ends, and such regions coalesce to form a substantially continuous layer on the insulating layer. A second plurality of nanowires is established on the substantially continuous layer.

12 Claims, 5 Drawing Sheets

MULTI-LEVEL NANOWIRE STRUCTURE AND METHOD OF MAKING THE SAME

CROSS-REFERENCE TO RELATED APPLICATION

The present application claims priority from provisional application Ser. No. 61/083,822, filed Jul. 25, 2008, the contents of which are incorporated herein by reference in their entirety.

BACKGROUND

The present disclosure relates generally to multi-level nanowire structures and methods of making the same.

Since the inception of semiconductor technology, a consistent trend has been toward the development of smaller device dimensions and higher device densities. As a result, nanotechnology has seen explosive growth and generated considerable interest. Nanotechnology is centered on the fabrication and application of nano-scale structures, or structures having dimensions that are often 5 to 100 times smaller than conventional semiconductor structures. Nanowires are included in the category of nano-scale structures.

Nanowires are wire-like structures having at least one linear dimension (e.g., diameter) ranging from about 1 nm to about 1 μm. For some applications, it may be desirable that the wire-like structures have at least one linear dimension as large as 10 μm. Nanowires are suitable for use in a variety of applications, including functioning as conventional wires for interconnection applications or as semiconductor devices. Nanowires are also the building blocks of many potential nano-scale devices, such as nano-scale field effect transistors (FETs), p-n diodes, light emitting diodes (LEDs) and nanowire-based sensors, to name a few.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

Structures including multiple levels of nanowires may be suitable for use in a variety of systems/devices, including, but not limited to, optical detection systems, imagers, and solar cells. In embodiments of the structure disclosed herein, each level includes at least some nanowires that are positioned at a predetermined crystallographically defined angle and/or are positioned substantially perpendicular with respect to a surface of a layer or substrate upon which the nanowires are established. It is believed that the nanowires positioned at the predetermined crystallographically defined angle and/or substantially perpendicularly in each level of the structure enhance control over the system. Furthermore, the crystallographic orientation of such nanowires allows polarization effects to be used in optical detection.

Figure 1:
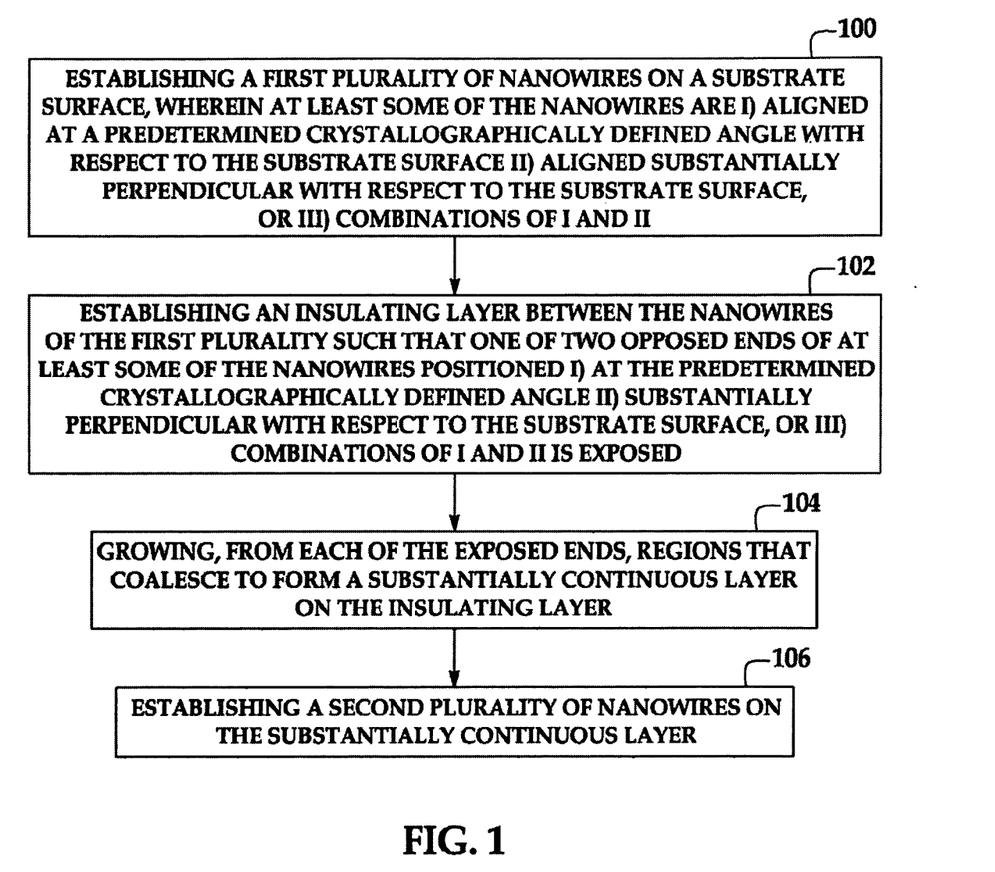
FIG. 1 is a flow diagram illustrating an embodiment of the method for making a multi-level nanowire structure.

Referring now to FIG. 1, an embodiment of the method for forming a multi-layered nanowire structure is depicted. The method generally includes establishing a first plurality of nanowires on a substrate surface, wherein at least some of the nanowires are I) aligned at a predetermined crystallographically defined angle with respect to the substrate surface, II) aligned substantially perpendicular with respect to the substrate surface, or III) combinations of I and II, as shown at reference numeral 100; establishing an insulating layer between the nanowires of the first plurality such that one of two opposed ends of at least some of the nanowires positioned I) at the predetermined crystallographically defined angle, II) substantially perpendicular with respect to the substrate surface, or III) combinations of I and II is exposed, as shown at reference numeral 102; growing, from each of the exposed ends, regions that coalesce to form a substantially continuous layer on the insulating layer, as shown at reference numeral 104; and establishing a second plurality of nanowires on the substantially continuous layer, as shown at reference numeral 106. It is to be understood that embodiments of the method will be further discussed in reference to the remaining Figures.

Figure 2A:
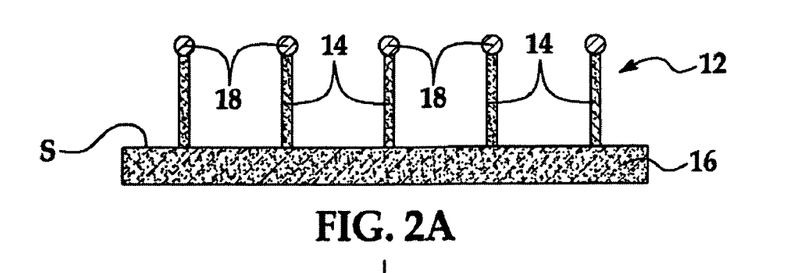
FIGS. 2A through 2G are semi-schematic cross-sectional views which together illustrate an embodiment of a method of making an embodiment of the multi-level nanowire structure.
Figure 2B:
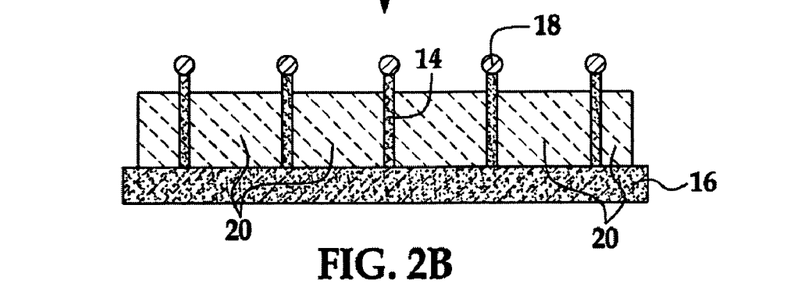
Figure 2C:
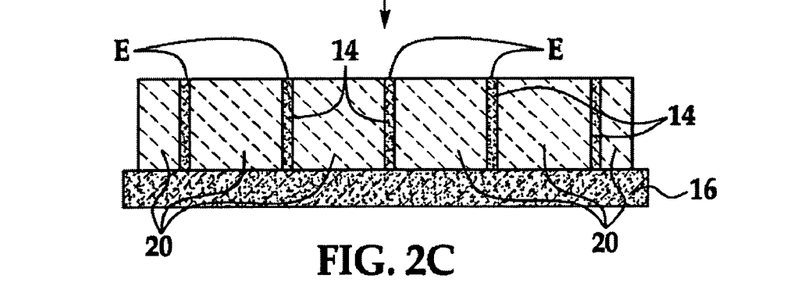
Figure 2D:
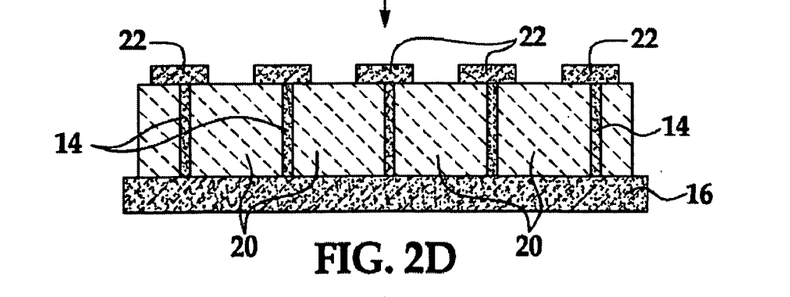
Figure 2E:
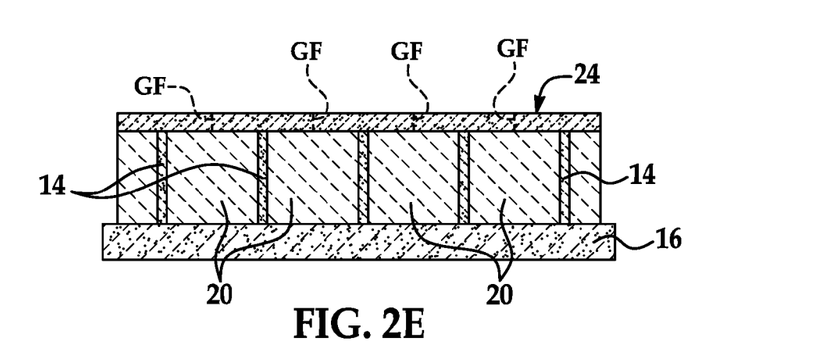
Figure 2F:
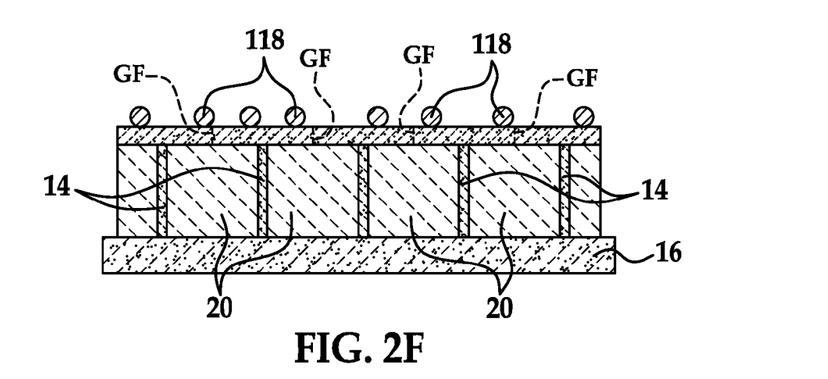
Figure 2G:
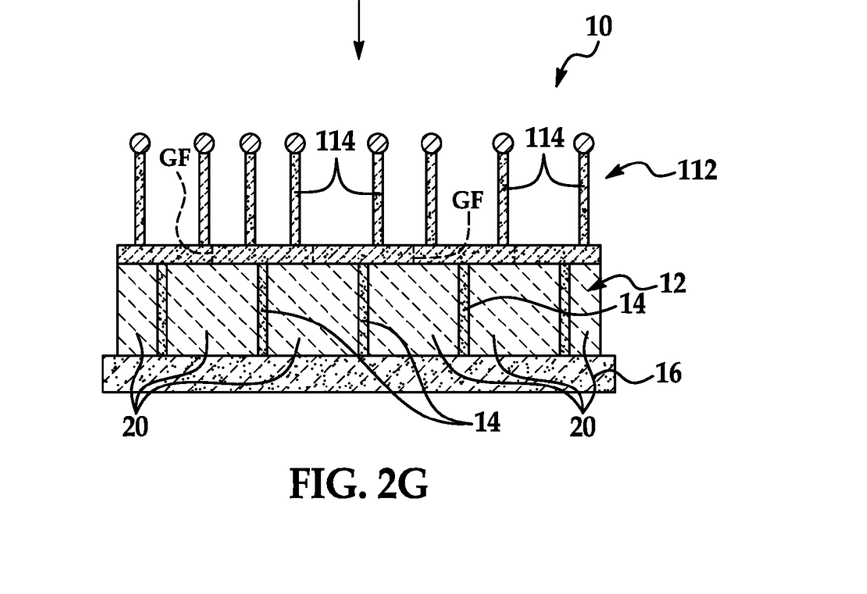

FIGS. 2A through 2G illustrate one embodiment of the method of FIG. 1. The resulting structure 10 of this embodiment of the method is shown in FIG. 2G. As shown in FIG. 2A, a first plurality 12 of nanowires 14 is established on a substrate 16. In this embodiment, the substrate 16 is formed of a single crystalline material. Such single crystalline materials may be conductors (e.g., metal), semiconductors (e.g., silicon), or insulators (e.g., sapphire ($Al_2O_3$)). Non-limiting examples of such single crystalline materials include silicon, gallium arsenide, indium phosphide, silicon carbide, sapphire ($Al_2O_3$), gallium phosphide, or germanium. It is to be understood that in some embodiments, other substrate materials may be used, and non-limiting examples of such other suitable materials are described further hereinbelow in reference to the FIG. 3 series.

It is to be understood that an insulator material may be used for the substrate 16 (or 16' discussed hereinbelow) in embodiments of the structure 10 (FIG. 2G), 10' (FIG. 3G), 10" (FIG. 4) in which electrical connection is not necessary or desirable. Non-limiting examples of such structures include optical or photonic structures.

As shown in FIG. 2A, the use of a single crystalline material of a particular crystallographic orientation as the substrate 16 results in each of the nanowires 14 of the first plurality growing at a predetermined crystallographically defined angle with respect to the plane of the substrate surface S because the established nanowires 14 usually have a particular crystallographic growth axis. The growth axis does not depend upon the crystallographic orientation of the growth surface S, rather the angle(s) at which the nanowires 14 grow depends, at least in part, on the crystallographic orientation of the growth surface S. In a non-limiting example, the nanowires 14 grown at the predetermined crystallographically defined angle are positioned substantially perpendicular to the substrate surface S. Because the crystallographic growth axis is often in the <111> direction, substantially perpendicular nanowires 14 are often grown from a substrate 16 having <111> crystallographic orientation. The term "substantially perpendicular", as used herein, means that the nanowires 14 grow or are otherwise formed in a direction that ranges from about 70° to about 110° from the surface upon which the nanowires 14 are established. In some instances, the substantially perpendicular nanowires 14 are approximately 90° (e.g., from about 85° to about 95°) from the surface.

It is to be understood, however, that the crystallographically defined angle may be non-perpendicular with respect to the substrate surface S. Nanowires 14 grown from substrates 16 having crystallographic orientations are generally aligned as close as possible to the crystallographic axes of the substrate 16, which correspond to the crystallographic growth axis of the nanowires 14. As a non-limiting example, if the substrate 16 is oriented with its <100> plane as the surface S, nanowires 14 with <111> crystallographic growth axis grow in four <111> directions about 35° from the surface S.

Growth of the nanowires 14 may be accomplished using catalyst nanoparticles 18, anisotropic growth or selective area growth. The nanowires 14 may also be formed via etching. When using catalyst nanoparticles 18, it is to be understood that the material that forms the nanowires 14 is exposed to the catalyst nanoparticles 18, for example, in the form of an atomic or molecular species. In one non-limiting example, a gaseous precursor containing one or more components of material that form the nanowires 14 is exposed to the catalyst nanoparticles 18. In a non-limiting example, different gaseous precursors may be used to supply the different components of a compound semiconductor nanowire 14 (e.g., one gas may contain a Ga species and another gas may contain an As species when forming GaAs nanowires). Such materials may also be supplied, for example, by physical transport (i.e., from the gas phase or from an underlying substrate/layer). Anisotropic growth also requires the supply of nanowire forming materials (e.g., from a gaseous source, by physical vapor deposition, or from an underlying substrate/layer). Selective area growth may be desirable in combination with the other techniques (e.g., anisotropic growth).

As previously mentioned, etching may also be used to form the nanowires 14. In such an embodiment, a layer of a nanowire material is established on the substrate surface S and is etched to form the nanowires 14. It may be desirable to utilize a material for the nanowire layer that is different than that of the substrate 16 so that anisotropic etching is stopped at the surface S. In another embodiment, the substrate 16 may be formed or may have a top portion formed of a material suitable for the nanowires 14. In this embodiment, the substrate 16 (or the top portion thereof) may be etched to form the nanowires 14.

Forming the first plurality 12 of nanowires 14 may include establishing the catalyst nanoparticles 18 on the substrate surface S. In one embodiment, the catalyst nanoparticles 18 may be formed by depositing (on the substrate surface S) material(s) that subsequently form the catalyst nanoparticles 18 (e.g., upon exposure to heating). In this embodiment, suitable deposition processes include, but are not limited to physical deposition processes, solution deposition processes, chemical deposition processes, electrochemical deposition processes, physical vapor deposition processes, chemical vapor deposition processes, and/or combinations thereof. In another embodiment, pre-formed catalyst nanoparticles 18 may be deposited on the substrate surface S. In this embodiment, non-limiting examples of suitable techniques to establish the catalyst nanoparticles 18 include, but are not limited to, physical deposition or solution deposition. Non-limiting examples of suitable catalyst nanoparticle 18 materials include gold, titanium, platinum, palladium, gallium, nickel, aluminum, iron, or combinations thereof.

Generally, the nanowires 14 are formed of semiconductor materials. Non-limiting examples of such materials include silicon, germanium, indium phosphide, gallium arsenide, gallium nitride, gallium phosphide, aluminum arsenide, indium arsenide, indium nitride, or the like, or alloys thereof, or combinations thereof. In some instances, the nanowires 14 are formed of undoped or lightly doped materials. In other instances, the growing nanowires 14 may be exposed to one or more dopants that is/are capable of introducing different conductivity types to one or more segments of the nanowire 14. In an embodiment, the dopant is introduced with the precursor gas. In another embodiment, the dopant is introduced subsequent to growth of the nanowires 14, for example, by gas-phase doping, ion implantation, or diffusion from a dopant-containing oxide layer.

In some instances, the nanowires 14 are formed with segments that are doped differently, such that p-n junctions are formed along the length of the nanowires 14. For example, one of the segments is doped p-type or n-type and the other of the segments is doped the other of n-type or p-type. When the nanowires 14 are doped to have segments with different conductivity types along their length, junctions (not shown) are axially formed in the nanowire 14 at the interface of the two differently doped segments.

The nanowires 14 may also be grown and doped to include multiple p-type and n-type segments, or to include an undoped or lightly doped (compared to the other doped segments) semiconductor region between two doped regions. Dopants for introducing p-type conductivity into group IV semiconductors include, but are not limited to boron, other like elements, or combinations thereof; and dopants for introducing n-type conductivity into group IV semiconductors include, but are not limited to phosphorus, arsenic, antimony, other like elements, or combinations thereof. Different dopants may be suitable for group III-V materials, such as, for example silicon, carbon, zinc, or the like, or combinations thereof. It is to be understood that the multiple segments may also be formed of different materials so that one axial segment is composed of a different material than the previous segment.

It is to be understood that the nanowires 14 may also include a junction formed radially therein. Such nanowires 14 are grown to a desirable length, and then the deposition conditions are changed to favor non-catalyzed growth so as to grow a shell of a differently doped material or of a different material on the previously formed nanowires 14. This junction is located at the interface of the core nanowire 14 and its shell. In other instances, a junction may be formed radially in the nanowire 14 using diffusion doping.

In some embodiments, the nanowires 14 may be clad with a material having a lower refractive index than the refractive index of the nanowire material. It is believed that such a material may assist in retaining light within the nanowires 14 until such light is absorbed by the active region. It is to be understood that with a suitable combination of refractive indices and a shallow angle, light in the nanowires 14 may be totally internally reflected and may not penetrate from a high refractive index core into low refractive index cladding layer. In addition, a properly formed coating on the nanowire 14 may reduce the nanowire 14 surface-state or interface-state density and therefore reduce the surface recombination so that the photogenerated carriers are collected, rather than recombined at the surface of the nanowire 14.

The nanowires 14 disclosed herein may also include a core, a shell and a light absorbing layer established between the core and shell. Generally, the core is formed during initial nanowire 14 growth, and is doped to have a first conductivity type. Doping of the core may be accomplished during or after growth of the nanowire 14 as described hereinabove. The light absorbing layer is then established on the doped core. It is to be understood that the light absorbing layer may be lightly doped or undoped (intrinsic) (in this embodiment, "lightly doped" means that the light absorbing layer includes less dopant than the core and/or the shell, and "undoped (intrinsic)" means that no dopant atoms are purposely added to the nanowire 14). The light absorbing layer may be doped with the same or a different conductivity type dopant than the core and/or shell, depending, at least in part, on the desirable function of the structure 10. The light absorbing layer may also be formed of the same or a different semiconductor material than the core material. In some instances, the light absorbing layer is grown on the core, and in other instances, the light absorbing layer is established on the core. This embodiment of the nanowires 14 also include the shell grown or otherwise established on the light absorbing layer.

When it is desirable that the structure 10 function in photoconductive mode, it is to be understood that the core, light absorbing layer and shell of the nanowires 14 have the same conductivity type as the substrate 16 and substantially continuous layer 24 (discussed further hereinbelow).

If the shell of the nanowire 14, in this non-limiting embodiment, is a semiconductor material, it may be doped to have a conductivity type that is different than the conductivity type of the core. In this embodiment, the core and shell are collecting electrodes. The light absorbing layer between the core and shell forms a p-i-n or n-i-p diode. This structure may be illuminated along the axis of the nanowire 14 or at any desirable angle. In other embodiments, the shell may be a metal, rather than a semiconductor material. In such instances, it may form a rectifying contact to the lightly doped light absorbing layer, thereby creating a junction.

When such core/shell nanowires 14 are used in the embodiments of the structure 10 (and 10', 10" shown in FIGS. 3G and 4, respectively) disclosed herein, the inner cores may be connected at either the top or bottom of the plurality 12 (i.e., to one of 16 or 24), and the outer shells may be connected at the other of the bottom or top of the plurality 12 (i.e., to the other of 24 or 16). With this structure, a relatively large light collecting path is formed (approximately the height of the nanowires 14), while the distance between the two collecting electrodes (the core and shell) remains short to allow rapid collection of photogenerated carriers and low recombination. It is believed that decoupling the light absorbing distance from the carrier collecting distance improves the performance of the structure 10, 10', 10".

Figure 3A:
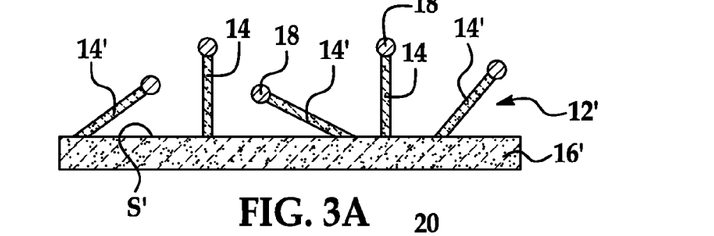
FIGS. 3A through 3G are semi-schematic cross-sectional views which together illustrate another embodiment of the method of making another embodiment of the multi-level nanowire structure.
Figure 3B:
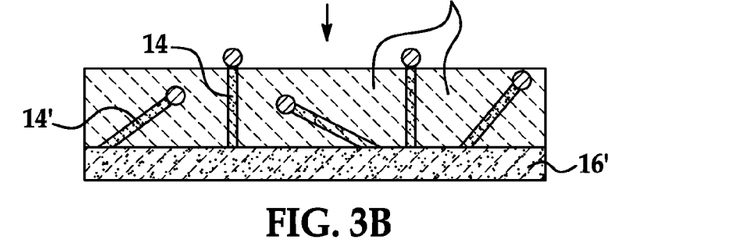
Figure 4:
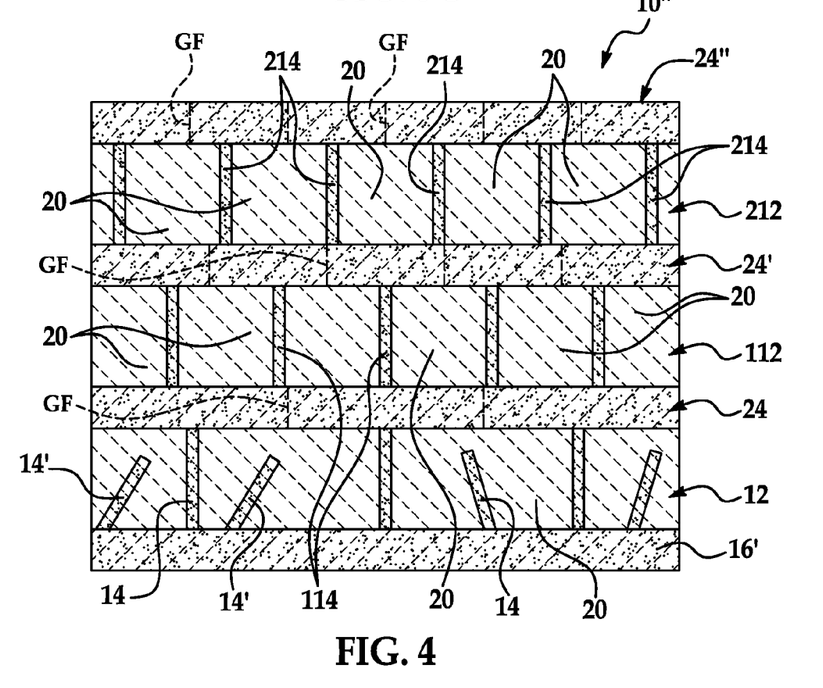
FIG. 4 is a semi-schematic cross-sectional view of another embodiment of the multi-level nanowire structure.

It is to be understood that the methods disclosed herein for growing the first plurality 12 of nanowires 14 may also be used to grow other nanowires (for example, nanowires 114 of a second plurality 112 shown in FIG. 2G or nanowires 14, 14' of the first plurality 12' shown in FIG. 3A or nanowires 214 of the third plurality 212 shown in FIG. 4). It is to be understood however, that the methods disclosed herein for etching the first plurality 12 of nanowires 14 may be used to form nanowires 114 and nanowires 214.

Referring now to FIG. 2B, after the first plurality 12 of nanowires 14 is grown or etched to a desirable height, an insulating layer 20 is formed on all or a portion of the substrate surface S such that it surrounds at least a portion of each of the nanowires 14. Such a layer 20 may be deposited. Examples of suitable deposition techniques include, but are not limited to CVD, PECVD, spin-on insulator, sputtering, laser ablation, e-beam evaporation, or combinations thereof. The layer 20 may also be formed through oxidation. Non-limiting examples of materials suitable for the insulating layer 20 include silicon dioxide, silicon nitride, spin-on-glass, aluminum oxide, phosphosilicate glass, borosilicate glass, or the like.

In some instances, the insulating layer 20 is established such that it fills the entire space between adjacent nanowires 14 without covering the ends that are attached to catalyst nanoparticles 18. In other instances, the insulating layer 20 is established such that it fills the entire space and covers the ends E (and if present, the catalyst nanoparticles 18 attached to the ends) of the nanowires 14.

The layer 20 and the nanowires 14 may then be exposed to etching or planarization (e.g., CMP or chemical mechanical planarization/polishing or chemical or mechanical etching/planarization techniques or reactive ion etching) to form a substantially planar surface in which the end E of at least some of the nanowires 14 is exposed, as shown in FIG. 2C. The term "substantially planar", as used herein, generally means 1) that the surface of the insulating layer 20 and the exposed ends E form a planar surface, 2) that the ends E extend/protrude slightly beyond the surface of the insulating layer 20 or 3) that the ends E are recessed slightly below the surface of the insulating layer 20. In embodiments in which catalyst nanoparticles 18 are used for nanowire growth, the planarization process may also be used to remove the catalyst nanoparticles 18 (as shown in FIG. 2C). Alternatively, the catalyst nanoparticles 18 may be removed by a chemically selective etching process. It is to be understood in embodiments in which the desirable end E of the nanowires 14 is exposed, the planarization process may not be desirable and/or needed.

As shown in FIG. 2D, regions 22 are grown from the exposed ends E of the nanowires 14. In one embodiment, epitaxial growth is used to grow the regions 22. Such epitaxial growth is generally non-catalyzed. Each region 22 grows vertically and laterally until adjacent laterally growing regions 22 impinge on each other to form a substantially continuous layer 24 shown in FIG. 2E. In some instances, the rate of lateral growth may be faster than the rate of vertical growth. In other instances, the growth rates are the same or the vertical growth rate is faster than the lateral growth rate. It is to be further understood that such a layer 24 may include a few isolated holes. In a non-limiting example, the regions 22 and the resulting layer 24 are formed of silicon, germanium, alloys thereof, gallium arsenide, indium arsenide, indium phosphide, gallium phosphide, or another compound semiconductor. This layer 24 may function as an intermediate electrode in the structure 10. In some instances, discontinuities or defects, analogous to low-angle grain boundaries, may form where two growth fronts GF merge (e.g., at the hidden lines shown in FIGS. 2E-2G). It is believed that such low angle grain boundaries will not significantly impede the lateral majority-carrier current flow in the layer 24. Furthermore, it is believed that such defects may be reduced by controlling the epitaxial growth conditions (e.g., Cl:Si ratio in the gas phase) at different times during region 22 growth to favor growth of different facets.

It is to be understood that the crystallographic orientation of the regions 22 (and the resulting substantially continuous layer 24) depends, at least in part, on the crystallographic orientation of the nanowires 14 from which they are grown. For example, when the nanowires 14 (from which the regions 22 are grown) have <111> axial crystalline orientation and are grown from a <111>-oriented substrate 16 so that they grow substantially perpendicular to the surface S thereof, the substantially continuous layer 24 also has <111> crystallographic orientation.

A second plurality 112 of nanowires 114 (shown in FIG. 2G) may be grown on the substantially continuous layer 24. The nanowires 114 may be formed via any of the previously described methods for forming nanowires 14. As shown in FIGS. 2F and 2G, the nanowires 114 are formed by establishing catalyst nanoparticles 118 on the substantially continuous layer 24, and exposing such nanoparticles 118 to an atomic or molecular species including a material of which the nanowires 114 are to be formed. When epitaxial growth is used to form the substantially continuous layer 24, the angle of the nanowires 114 is determined, at least in part, by the crystallographic orientation of the substantially continuous layer 24. In such instances, the substantially continuous layer 24 is grown from nanowires 14 in the first plurality 12 that have predetermined crystallographically defined angles or are substantially perpendicular, and therefore have the desirable growth axis perpendicular. As a non-limiting example, when the substantially continuous layer 24 has <111> orientation and the resulting nanowires 114 also have <111> axial crystalline orientation, the nanowires 114 are substantially perpendicular to the surface of the substantially continuous layer 24.

If the substantially continuous layer 24 is not oriented (e.g., when some techniques other than epitaxial growth are used to form the substantially continuous layer 24), the growth axis of the nanowires 114 may not be perpendicular to the plane of the substantially continuous layer 24. The angle at which the nanowires 14 are grown may depend on the crystal orientation of the layer 24 or it may be random. If the growth angles are random, it is to be understood that at least some of the nanowires 114 will be substantially perpendicular and used to form, for example, a second substantially continuous layer.

The second plurality 112 of nanowires 114 may also be formed by anisotropic growth, selective area growth or etching. When etching is utilized, a layer of the nanowire material may be grown on the substantially continuous layer 24. It may be desirable that the layer of nanowire material be a different material than the substantially continuous layer 24 so that the nanowire material layer can be etched anisotropically, with the etching stopping at the surface of the substantially continuous layer 24. It is to be understood that nanowires 14, 114 formed via etching have the same direction (with respect to the surface upon which they are formed). In instances in which reactive ion etching or ion milling is used, the direction of the formed nanowires 14, 114 depends, at least in part, on the angle between the surface and the etching beam. The direction of the nanowires 14, 114 formed via etching techniques may depend on other factors which are unique to the technique used.

It is to be understood that the second plurality 112 of nanowires 114 may be formed of the same or a different material than the nanowires 14 of the first plurality 12. Furthermore, the method disclosed herein may be repeated to grow additional substantially continuous layers (e.g., 24', 24" shown in FIG. 4) and nanowires (e.g., 214 shown in FIG. 4) thereon.

Figure 3C:
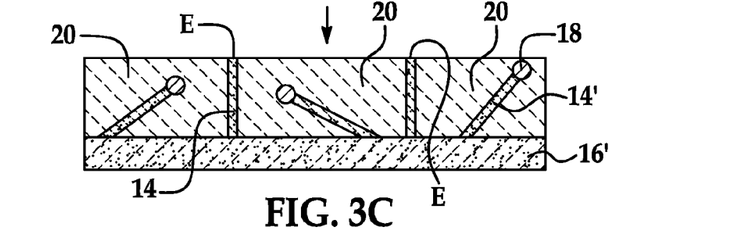
Figure 3D:
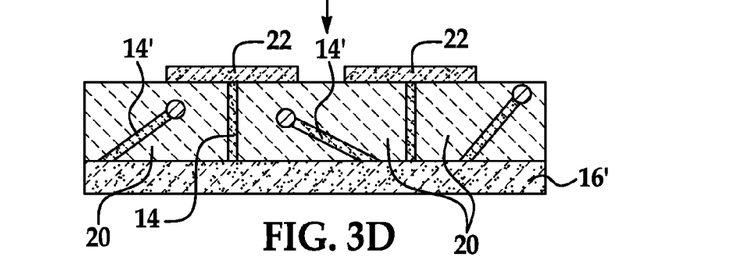
Figure 3E:
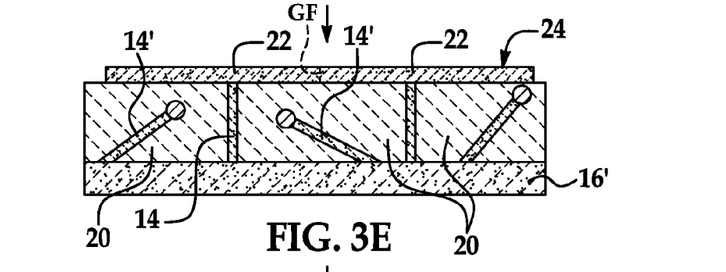
Figure 3F:
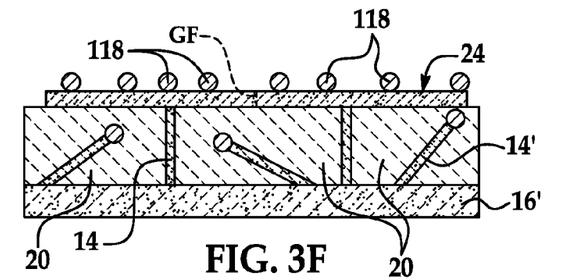
Figure 3G:
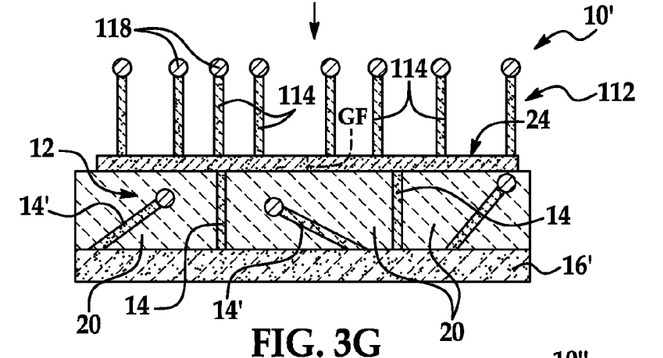

FIGS. 3A through 3G illustrate another embodiment of the method of FIG. 1, which results in the formation of another embodiment of the structure 10' (shown in FIG. 3G). In this embodiment, the substrate 16' is formed of amorphous materials or polycrystalline materials, such as, for example, amorphous or polycrystalline silicon, germanium, or gallium arsenide, glass, silicon dioxide, sapphire, indium tin oxide, silicon carbide, diamond, silicon nitride, other large bandgap semiconductors, or metals (e.g., gold, iron, aluminum, titanium, nickel, or platinum). As shown in FIG. 3A, when an amorphous or polycrystalline substrate 16' is used, there is no single alignment of the growing nanowires 14, 14', and the growing nanowires 14, 14' are positioned at different angles with respect to the growth surface S' (i.e., the nanowires 14' are not substantially in the same direction). Some of the nanowires 14 grow substantially perpendicular to the substrate surface S', and others of the nanowires 14' grow at non-perpendicular angles with respect to the substrate surface S'. When a polycrystalline substrate 16' is utilized, the angle of the nanowires 14, 14' with respect to the substrate surface S' will depend, at least in part, on the crystallography of the portion of the surface S' from which the nanowires 14, 14' are grown, and may vary among the different nanowires 14, 14'. When an amorphous substrate 16' is utilized, the substrate 16' has no crystal structure and no long range order, and thus there is no predetermined crystallographically defined angle and the nanowires 14, 14' grow at random angles with respect to the substrate surface S'.

As previously mentioned, the nanowires 14, 14' in this embodiment may be formed via any of the previously described growth methods. It is to be understood that etching is generally not suitable for forming nanowires 14, 14' that are positioned at a multiplicity of angles. Once the nanowires 14, 14' are grown, an insulating layer 20 (described hereinabove) is established such that it fills the entire space between adjacent nanowires 14, 14'. In this embodiment, the insulating layer 20 may cover the nanowire 14' while ends E of nanowires 14 (shown in FIG. 3C) remain exposed, or the insulating layer 20 may entirely cover each nanowire 14, 14'.

When the ends E of the nanowires 14 are covered by insulating layer 20 or have catalyst nanoparticles 18 attached thereto, the previously described planarization or etching process may be used to expose ends E. In some instances, after planarization or etching is performed, the non-perpendicular nanowires 14' (and any catalyst nanoparticles 18 attached thereto) may remain covered by the remaining insulating layer 20 (as shown in FIG. 3C).

As shown in FIG. 3D, regions 22 are then epitaxially grown from the exposed ends E of the substantially perpendicular nanowires 14. As previously described, each region 22 grows vertically and laterally until the growth fronts GF of adjacent laterally growing regions 22 impinge on each other to form the substantially continuous layer 24, shown in FIG. 3E. Also as previously described, the crystallographic orientation of the regions 22 (and the resulting substantially continuous layer 24) depends, at least in part, on the crystallographic orientation of the nanowires 14 from which they are grown. When the substantially perpendicular nanowires 14 have <111> axis perpendicular to the substrate surface S', the substantially continuous layer 24, grown using the ends E of such nanowires 14 as seeds, also has <111> crystallographic orientation. It is to be understood however, that different regions of the substantially continuous layer 24 may have different in-plane orientation.

The second plurality 112 of nanowires 114 (shown in FIG. 3G) may be grown on the substantially continuous layer 24 or formed via etching of a nanowire material layer established on the substantially continuous layer 24. As shown in FIGS. 3F and 3G, the nanowires 114 are formed by establishing catalyst nanoparticles 118 on the substantially continuous layer 24, and exposing such nanoparticles 118 to an atomic or molecular species including a material of which the nanowires 114 are to be formed. When the substantially continuous layer 24 has <111> crystallographic orientation and the resulting nanowires 114 also have <111> crystallographic growth axis, the nanowires 114 are preferentially aligned substantially perpendicular to the surface or plane of the substantially continuous layer 24.

The second plurality 112 of nanowires 114 may be formed of the same or a different material than the nanowires 14, 14' of the first plurality 12'. Furthermore, the method disclosed herein may be repeated to grow additional substantially continuous layers and nanowires thereon.

Referring now to FIG. 4, an embodiment of the structure 10" including multiple substantially continuous layers 24, 24', 24" and multiple pluralities 12, 112, 212 of nanowires 14, 14', 114, 214 is depicted. It is to be understood that the previously described method steps are repeated to form such additional layers and nanowires.

It is to be understood that in any of the embodiments disclosed herein, the substrate 16, 16' and substantially continuous layers 24, 24', 24" may be doped to exhibit a desirable conductivity type. Such doping is generally suitable when electrical conduction is desirable.

As depicted, the nanowires 14, 114, 214 are established such that an electrical connection may be made at both ends of the nanowires 14, 114, 214 (e.g., with the substrate 16, 16' or one of the substantially continuous layers 24, 24', 24"). Some of the nanowires 14' are not connected at both ends, and thus generally do not contribute to the electrical performance of the structure 10".

Furthermore, it is to be understood that in any of the embodiments disclosed herein, the substantially continuous layers 24, 24', 24" may be amorphous, polycrystalline, or single-crystalline. The properties can be chosen such that the resulting structure 10, 10', 10" is suitable for use in a desired application.

In one embodiment, the structure 10, 10', 10" is a photodiode (e.g., a photodetector or a solar cell). In this application and referring to FIG. 4 for illustrative purposes, the top substantially continuous layer 24" is chosen to be transparent to the wavelengths of light to be detected by all underlying pluralities 12, 112, 212 of nanowires 14, 114, 214. Analogously, the materials of the intermediate substantially continuous layers 24, 24' are selected to be transparent to wavelengths of light to be detected by the pluralities 12, 112 of nanowires 14, 14', 114 below the intermediate substantially continuous layers 24, 24'. The material for each of the pluralities 12, 112, 212 of nanowires 14, 14', 114, 214 may be selected to be absorbing for the wavelengths of light that are desired to be absorbed by the particular nanowires 14, 14', 114, 214. For example, the bandgap of the topmost plurality 212 of nanowires 214 may be larger than that of the other pluralities 12, 112. Only photons with energy greater than the bandgap of these nanowires 214 (and wavelengths shorter than the corresponding wavelength) are absorbed by this plurality 212. Photons with less energy are not absorbed and pass through the underlying substantially continuous layer 24', which has been selected to be transmissive to these wavelengths. Photons with energy greater than the bandgap of the nanowires 114 are absorbed in this plurality 112 of nanowires 114. When more than two pluralities 12, 112, 212 of nanowires 14, 14', 114, 214 are present, photons of successively lower energies are absorbed by the lower layers of nanowires 14, 14', 114, 214 composed of materials with successively smaller bandgaps.

While several embodiments have been described in detail, it will be apparent to those skilled in the art that the disclosed embodiments may be modified. Therefore, the foregoing description is to be considered exemplary rather than limiting.

What is claimed is:

1. A method for making a multi-level nanowire structure, comprising:

establishing a first plurality of nanowires on a substrate surface, wherein at least some of the nanowires of the first plurality are positioned i) at a predetermined crystallographically defined, non-perpendicular angle with respect to the substrate surface, ii) substantially perpendicular with respect to the substrate surface, or iii) combinations of i and ii;

establishing an insulating layer between the nanowires of the first plurality such that one of two opposed ends of at least some of the nanowires positioned i) at the predetermined crystallographically defined, non-perpendicular angle with respect to the substrate surface, ii) substantially perpendicular with respect to the substrate surface, or iii) combinations of i and ii is exposed;

growing, from each of the exposed ends, regions that coalesce to form a substantially continuous layer on the insulating layer, where the substantially continuous layer is connected to the exposed ends of the at least some of the nanowires of the first plurality;

establishing a second plurality of nanowires on the substantially continuous layer such that at least some of the nanowires of the second plurality are positioned at different angles than at least some of the nanowires of the first plurality;

establishing a second insulating layer between the nanowires of the second plurality such that one of two opposed ends of at least some of the nanowires of the second plurality is exposed; and growing, from each of the exposed ends of the at least some of the nanowires of the second plurality, second regions that coalesce to form a second substantially continuous layer on the insulating layer, where the substantially continuous layer is connected to the exposed ends of the at least some of the nanowires of the second plurality;

wherein:

the second substantially continuous layer is transparent to wavelengths of light to be detected by the nanowires of the first plurality and the nanowires of the second plurality; and a bandgap of the nanowires of the second plurality is larger than a bandgap of the nanowires of the first plurality.

2. The method as defined in claim 1 wherein establishing the first plurality of nanowires is accomplished by one of:

i) depositing catalyst nanoparticles on the substrate surface; and exposing the catalyst nanoparticles to at least one atomic or molecular species including one or more materials of which the first plurality of nanowires is to be formed, whereby growth of the nanowires of the first plurality is initiated, and wherein one of the catalyst nanoparticles is attached to the one of the two opposed ends of each of the growing nanowires;

ii) establishing a layer of a nanowire material on the substrate surface; and etching the nanowire material layer, thereby forming the first plurality of nanowires; or iii) utilizing a substrate having a nanowire material at least at a top portion thereof; and etching the nanowire material at the at least the top portion, thereby forming the first plurality of nanowires.

3. The method as defined in claim 2 wherein establishing the insulating layer includes:

depositing an insulating material between the nanowires of the first plurality to a predetermined height; and polishing or etching the insulating material to expose the one of the two opposed ends, and to form a surface of the insulating layer that is substantially planar with each of the exposed ends.

4. The method as defined in claim 1 wherein the substrate is amorphous or polycrystalline, wherein at least some of the nanowires of the first plurality are positioned substantially perpendicular with respect to the substrate surface and at least some other of the nanowires of the first plurality are positioned at non-perpendicular angles with respect to the substrate surface, and wherein the substantially perpendicular nanowires have a height that is greater than a height of the non-perpendicular nanowires.

5. The method as defined in claim 4 wherein establishing the insulating layer includes:
  depositing an insulating material between the nanowires of the first plurality to a predetermined height; and
  polishing or etching the insulating material such that i) at least some of the non-perpendicular nanowires remain covered by the insulating material, ii) at least some of the substantially perpendicular nanowires include the exposed ends, and iii) a surface of the insulating layer is substantially planar with the exposed ends.

6. The method as defined in claim 1 wherein establishing the second plurality of nanowires is accomplished by:
  depositing a plurality of catalyst nanoparticles on a surface of the substantially continuous layer; and
  exposing the plurality of catalyst nanoparticles to at least one atomic or molecular species including one or more materials of which the second plurality of nanowires is to be formed, thereby forming the second plurality of nanowires, at least some of which are i) aligned at a predetermined crystallographically defined angle with respect to the surface of the substantially continuous layer, ii) aligned substantially perpendicular with respect to the surface of the substantially continuous layer, or iii) combinations of i and ii.

7. The method as defined in claim 1 wherein each of the regions and the second regions grow substantially vertically and laterally across the insulating layer and the second insulating layer, respectively, and wherein lateral growth occurs at a faster rate than vertical growth.

8. The method as defined in claim 1 wherein growing the regions is accomplished via an epitaxial growth technique.

9. A multi-level nanowire structure, comprising:
  a substrate having a surface;
  a first plurality of nanowires established on the substrate surface, wherein at least some of the nanowires of the first plurality are positioned i) at a predetermined crystallographically defined, non-perpendicular angle with respect to the substrate surface, ii) substantially perpendicular with respect to the substrate surface, or iii) combinations of i and ii;
  an insulating layer established between the nanowires of the first plurality;
  a substantially continuous layer established on the insulating layer and connected to ends of at least some of the nanowires positioned i) at the predetermined crystallographically defined, non-perpendicular angle with respect to the substrate surface, ii) substantially perpendicular with respect to the substrate surface, or iii) combinations of i and ii;
  a second plurality of nanowires established on the substantially continuous layer, at least some of the nanowires of the second plurality being positioned at different angles than at least some of the nanowires of the first plurality;
  a second insulating layer established between the nanowires of the second plurality; and
  a second substantially continuous layer established on the second insulating layer and connected to ends of at least some of the nanowires of the second plurality;
  wherein:
  the second substantially continuous layer is transparent to wavelengths of light to be detected by the nanowires of the first plurality and the nanowires of the second plurality; and
  a bandgap of the nanowires of the second plurality is larger than a bandgap of the nanowires of the first plurality.

10. The structure as defined in claim 9 wherein:
  the substrate is polycrystalline or amorphous;
  at least some of the nanowires of the first plurality are positioned substantially perpendicular with respect to the substrate surface, and at least some other of the nanowires of the first plurality are positioned at non-perpendicular angles with respect to the substrate surface; and
  each of the nanowires of the second plurality is positioned substantially perpendicular with respect to a surface of the substantially continuous layer.

11. The structure as defined in claim 9, further comprising:
  a third plurality of nanowires established on the second substantially continuous layer, the nanowires of the third plurality being positioned substantially perpendicular with respect to the second substantially continuous layer;
  a third insulating layer established between the nanowires of the third plurality; and
  a third substantially continuous layer established on the third insulating layer and connected to ends of at least some of the nanowires of the third plurality;
  wherein:
  the third substantially continuous layer is transparent to wavelengths of light to be detected by the nanowires of the first plurality, the nanowires of the second plurality, and the nanowires of the third plurality; and
  a bandgap of the nanowires of the third plurality is larger than a bandgap of the nanowires of the first plurality and of the second plurality.

12. The structure as defined in claim 9 wherein the structure is selected from a photodiode, a photodetector, and a solar cell.

* * * * *

UNITED STATES PATENT AND TRADEMARK OFFICE
CERTIFICATE OF CORRECTION

| | | |
|---|---|---|
| PATENT NO. | : 8,198,706 B2 | Page 1 of 1 |
| APPLICATION NO. | : 12/243853 | |
| DATED | : June 12, 2012 | |
| INVENTOR(S) | : Theodore I. Kamins et al. | |

It is certified that error appears in the above-identified patent and that said Letters Patent is hereby corrected as shown below:

In column 10, line 62, in Claim 2, delete "at the at least" and insert -- at least at --, therefor.

Signed and Sealed this
Eighth Day of January, 2013

David J. Kappos
*Director of the United States Patent and Trademark Office*